United States Patent
Dzahini et al.

(10) Patent No.: US 9,077,370 B2
(45) Date of Patent: Jul. 7, 2015

(54) DEVICE FOR CONVERTING ANALOGUE SIGNALS INTO DIGITAL SIGNALS

(71) Applicant: CENTRE NATIONAL DE LA RECHERCHE SCIENTIFIQUE (CNRS), Paris (FR)

(72) Inventors: Daniel Dzahini, Veurey Voroize (FR); Fatah-Ellah Rarbi, Rumilly (FR); Laurent Gallin-Martel, Saint Etienne de Crossey (FR)

(73) Assignee: CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 14/380,134

(22) PCT Filed: Feb. 26, 2013

(86) PCT No.: PCT/EP2013/053751
§ 371 (c)(1),
(2) Date: Aug. 21, 2014

(87) PCT Pub. No.: WO2013/127751
PCT Pub. Date: Sep. 6, 2013

(65) Prior Publication Data
US 2015/0022388 A1   Jan. 22, 2015

(30) Foreign Application Priority Data

Feb. 27, 2012   (FR) ..................... 12 51736

(51) Int. Cl.
*H03M 1/12* (2006.01)
*H03M 1/34* (2006.01)
*H03M 1/14* (2006.01)
*H03M 1/00* (2006.01)
*H03M 1/44* (2006.01)
*H03M 1/46* (2006.01)
*H03M 1/56* (2006.01)

(52) U.S. Cl.
CPC ............ *H03M 1/345* (2013.01); *H03M 1/12* (2013.01); *H03M 1/123* (2013.01); *H03M 1/145* (2013.01); *H03M 1/46* (2013.01); *H03M 1/56* (2013.01); *H03M 1/002* (2013.01); *H03M 1/124* (2013.01); *H03M 1/44* (2013.01)

(58) Field of Classification Search
CPC .......... H03M 1/12; H03M 1/14; H03M 1/40; H03M 1/44; H03M 1/46; H03M 1/124; H03M 1/145; H03M 1/164; H03M 1/002
USPC .................................................. 341/136–160
See application file for complete search history.

(56) References Cited

U.S. PATENT DOCUMENTS 5,463,395 A * 10/1995 Sawai ........................ 341/156
5,696,510 A * 12/1997 Paillardet et al. .......... 341/156
(Continued)

*Primary Examiner* — Lam T Mai
(74) *Attorney, Agent, or Firm* — Clark & Brody

(57) ABSTRACT

Method and device for converting analog signals, of a plurality of pathways, into digital signals. A common circuit (2, 3) generates first analog signals corresponding to high-order bits of digital signals. For each pathway, a first means compares the first analog signals with the signal to be converted. A first means (18) stores high-order bits corresponding to the value of a first analog signal close to the signal to be converted. A means (9) stores the deviation between the analog signal to be converted and said first detected value. A generator means (11, 12) generates a predetermined number of second analog signals. A second means compares by successive approximations said second analog signals with said deviation. A means (20) stores said low-order bits corresponding to the results arising from said second means of comparison. A means (22) assembles said high-order bits and said low-order bits.

5 Claims, 5 Drawing Sheets

(56) References Cited

U.S. PATENT DOCUMENTS

| | | | |
|---|---|---|---|
| 6,188,346 B1 * | 2/2001 | Waho et al. | 341/156 |
| 6,222,476 B1 * | 4/2001 | Lee et al. | 341/159 |
| 6,489,913 B1 * | 12/2002 | Hansen et al. | 341/156 |
| 7,924,198 B2 * | 4/2011 | Cui et al. | 341/145 |

* cited by examiner

DEVICE FOR CONVERTING ANALOGUE SIGNALS INTO DIGITAL SIGNALS

The present invention relates to the field of the conversion of analog signals into digital signals.

Particularly in the field of imagers comprising a matrix of sensors, the analog signals present at the ends of columns of sensors need to be converted into digital signals.

Document US-2007/0279506 describes a conversion device which carries out conversion with the aid of a ramp and conversion by successive approximations. This device is not satisfactory, however, in particular because of the use of a large number of electronic components, its slowness and the uncertainty relating to the correspondence between the original analog signal and the digital signal obtained.

Insofar as the width of the columns of sensors tends to be reduced in order to improve the quality of the images, difficulties arise which are associated with the speed of the conversions, reducing the electrical energy consumption of the electronic circuits used, obtaining a high resolution, that is to say obtaining a high number of bits of the digital signals, obtaining a reliable digital signal, that is to say one representing the analog signal as accurately as possible, and reducing the areas occupied by the electronic circuits, the width of which needs to be matched to the width of the sensor columns.

The object of the present invention is to provide a solution to these difficulties.

A method for converting analog signals, respectively present on a plurality of channels, into digital signals, is provided.

This method comprises: generation of a succession, common to all the channels, of predetermined first analog signals having predetermined values in a staircase with wide successive steps, each value of which corresponds to most-significant bits (m) of digital signals.

For each channel, the method comprises: comparison of the value of the analog signal to be converted successively with each of said predetermined values, detection of a predetermined first value of the first analog signal close to the value of the analog signal to be converted, storage of the values of the most-significant bits corresponding to said detected predetermined first value, storage of the residual or remainder resulting from the difference between the value of the analog signal to be converted and said detected predetermined value, comparison, by successive approximations, of said residual or remainder with predetermined second analog signals contained between two bounds of analog signals, the difference between which is greater than said step of said succession, successive storage of the states of the results of the comparison by successive approximations, corresponding to least-significant bits of digital signals.

Then, for each channel, the method comprises assembly of the most-significant bits and the least-significant bits, so as to deliver a digital signal corresponding to the value of the analog signal to be converted, this digital signal comprising the least-significant bits, with the exception of the highest, and the most-significant bits, to which the highest of the least-significant bits is added.

The method may comprise: comparison of the value of the analog signal to be converted successively with each of said predetermined values, in decreasing order, and detection of the predetermined first value of the first analog signal less than the value of the analog signal to be converted.

A device for converting analog signals, respectively present on a plurality of channels, into digital signals is also provided.

This device comprises a common generator circuit capable of generating a succession of predetermined first analog signals having predetermined first values corresponding to most-significant bits of digital signals.

Furthermore, for each channel, this device comprises a local circuit which comprises a first comparison means, including a single comparator, for comparing said predetermined first analog signals with the analog signal to be converted, a first means for storing the most-significant bits of digital signals, corresponding to the value of a predetermined first analog signal close to the corresponding analog signal to be converted and detected by said first comparison means, a means for storing the residual or remainder resulting from the difference between the value of the corresponding analog signal to be converted and said detected predetermined first value, a generator means capable of generating a predetermined number of second analog signals, a second comparison means, including said single comparator for comparing by successive approximations said second analog signals respectively with said residual or remainder, a second means for storing the least-significant bits of digital signals, corresponding to the results coming from said second comparison means, and an assembly means for assembling said most-significant bits and said least-significant bits, so as to deliver a digital signal corresponding to the corresponding analog signal to be converted.

The means for storing the residual or remainder may comprise a capacitor.

A matrix of sensors, which is equipped with a conversion device, the local circuits being placed at the ends of the columns of this matrix, on a line at the end of which the common circuit is placed, is also provided.

A conversion device according to the present invention will now be described by way of nonlimiting example, illustrated by the drawing in which.

Figure 1:
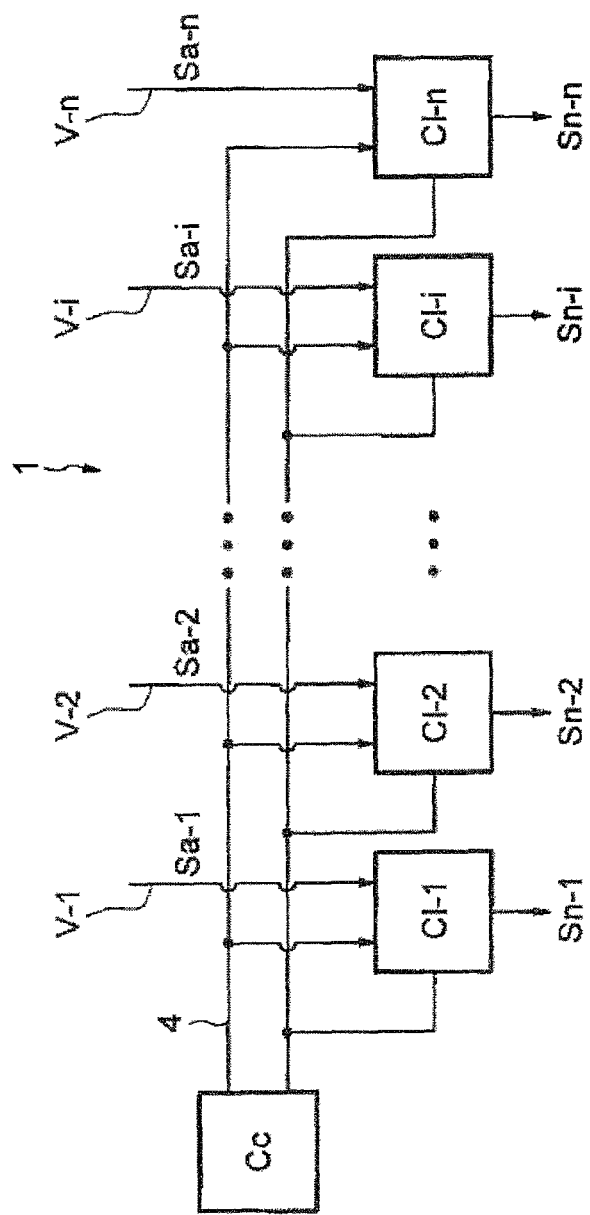
FIG. 1 represents an overall circuit diagram of the conversion device.

The conversion device 1 illustrated in FIG. 1 is intended for the conversion of analog signals Sa-1, Sa-2 . . . Sa-i . . . Sa-n present on a plurality of channels V-1, V-2 . . . V-i . . . V-n, which may, for example, be formed by the terminal connections of matrices of sensors, in particular of image sensors, light or thermal radiation sensors such as bolometers, photomultipliers, or detection sensors.

The conversion device 1 comprises a common electronic circuit Cc connected to a plurality of local circuits Cl-1, Cl-2 . . . Cl-i . . . Cl-n, which are adapted so that the analog signals Sa-1, Sa-2 . . . Sa-i . . . Sa-n which are respectively delivered to the local circuits Cl-1, Cl-2 . . . Cl-i are converted into digital signals Sn-1, Sn-2 . . . Sn-i . . . Sn-n available at outputs of these local circuits.

Figure 2:
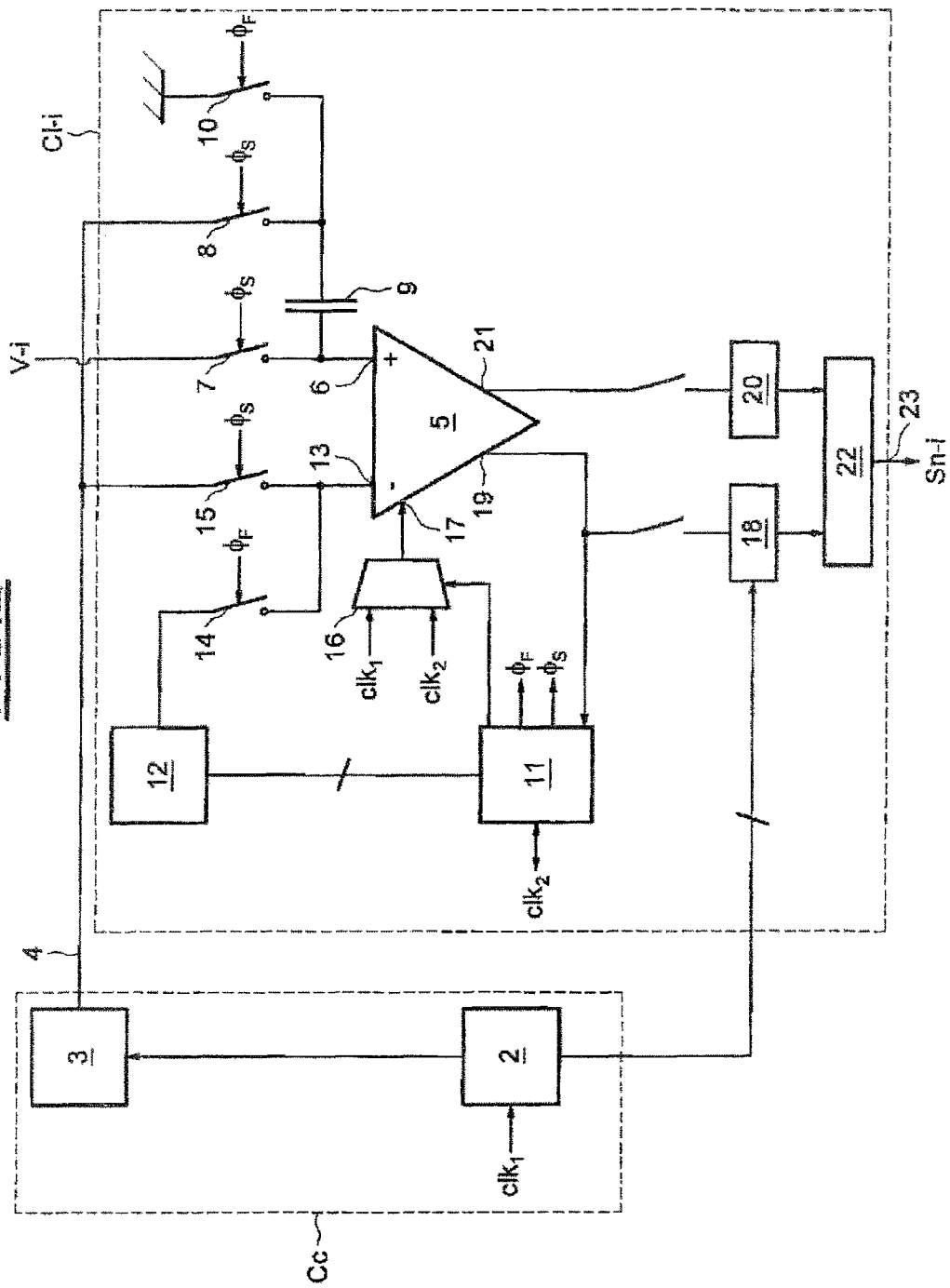
FIG. 2 represents a more detailed circuit diagram of the conversion device.

As illustrated in FIG. 2, the common electronic circuit Cc comprises a digital control circuit 2 subjected to a clock signal clk1 and capable of generating first digital signals, and a convertor 3 capable of converting these first digital signals into first analog signals, which are delivered on a common electrical connection line 4.

Each local circuit Cl-i comprises a comparator 5, one input 6 of which is connected to the corresponding channel V-i by means of a switch 7 and is connected to the common line 4 by means of a switch 8 and a capacitor 9, the capacitor 9 being placed between the input 6 and the switch 8.

The common connection between the switch 8 and the capacitor 9 is connected to the ground of the device by means of a switch 10.

Each local circuit Cl-i comprises a digital sequencer 11 subjected to a clock signal clk2 and connected to a convertor 12 capable of delivering second analog signals to another input 13 of the comparator 5 by means of a switch 14.

This other input 13 is connected to the common line 4 by means of a switch 15.

The digital sequencer 11 has an output connected to a control input of a selection circuit 16, which receives the clock signals clk1 and clk2 and the output of which is connected to a control input 17 of the comparator 5.

The digital sequencer 11 has an output delivering a signal $\Phi s$ for controlling the switches 7, 8 and 15, and an output delivering a signal $\Phi f$ for controlling the switches 10 and 14.

The digital sequencer 11 furthermore comprises a storage register 18, which is controlled by a command signal coming from an output 19 of the comparator 5 and an input of which is connected to an output of the digital control circuit 2.

The digital sequencer 11 furthermore comprises a storage register 20 connected to an output 21 of the comparator 5.

The digital sequencer 11 also comprises an assembly circuit 22 connected to the storage registers 18 and 20 and having an external output 23.

The conversion device 1 may operate in the following way.

Figure 3:
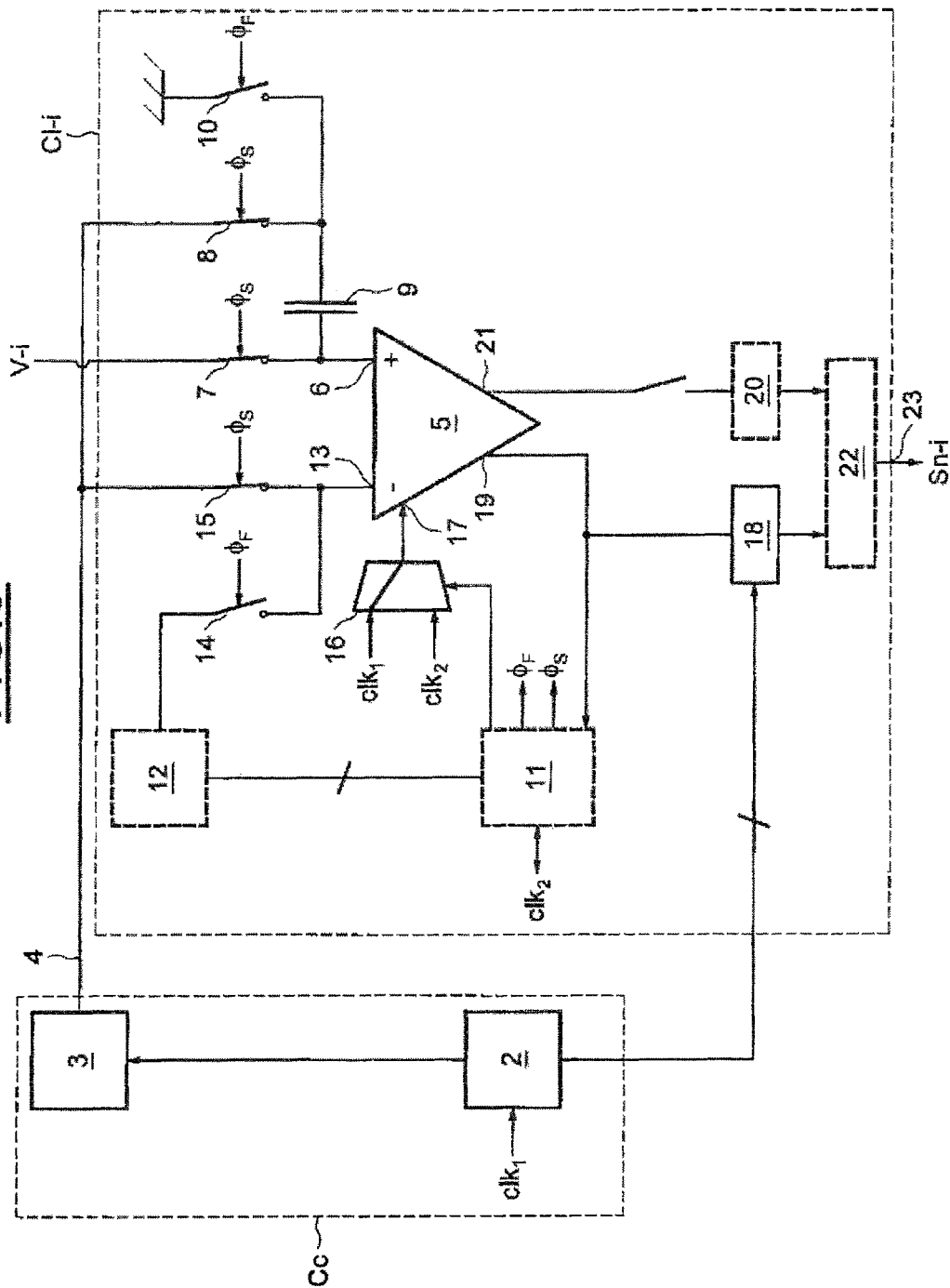
FIG. 3 represents a circuit diagram of the conversion device according to a first operational configuration.

In order to carry out a first conversion phase, the conversion device 1 is placed in a configuration illustrated in FIG. 3.

According to this configuration, the switches 7, 8 and 15 of each local circuit Cl-i are in the closed state, so that the input 6 of the comparator 5 is connected to the corresponding channel V-i and the input 13 of the comparator 5 is connected to the common line 4. The switches 10 and 14 of each local circuit Cl-i are in the open state. The comparator 5 is controlled by the clock clk1 through the circuit 16.

Under the effect of a succession of clock signals clk1, the digital control circuit 2 generates a succession of predetermined first encoded signals. Each encoded signal contains a plurality of states corresponding to most-significant bits m of predetermined digital signals.

The succession of predetermined encoded signals is converted by the convertor 3 into a succession of first analog signals, which are delivered by the connection line 4 to each of the local circuits Cl-i. These first analog signals have values in a staircase forming a ramp or a succession of levels, with wide and regular or irregular steps, these values decreasing successively. The maximum and minimum predetermined values of these first analog signals are selected so that the values of the analog signals Sa-i to be converted are included between these maximum and minimum values.

The operation of each local circuit Cl-i is then as follows. So long as the values of the levels of the analog signals coming from the converter 3 are higher than the value of the corresponding signal Sa-i to be converted, the output 19 of the comparator 5 remains unchanged. Conversely, as soon as an analog signal coming from the convertor 3 has a level value lower than the value of the analog signal Sa-i, the output 19 of the comparator 5 changes state.

This change of state of the output signal of the comparator 5 is sent to the storage register 18 and induces the recording in this storage register 18 of the encoded signal of most-significant bits m coming from the digital control circuit 2 and corresponding to the predetermined analog signal coming from the convertor 3 and has caused this change of state. For the local circuit Cl-i in question, a first conversion phase is completed.

Figure 4:
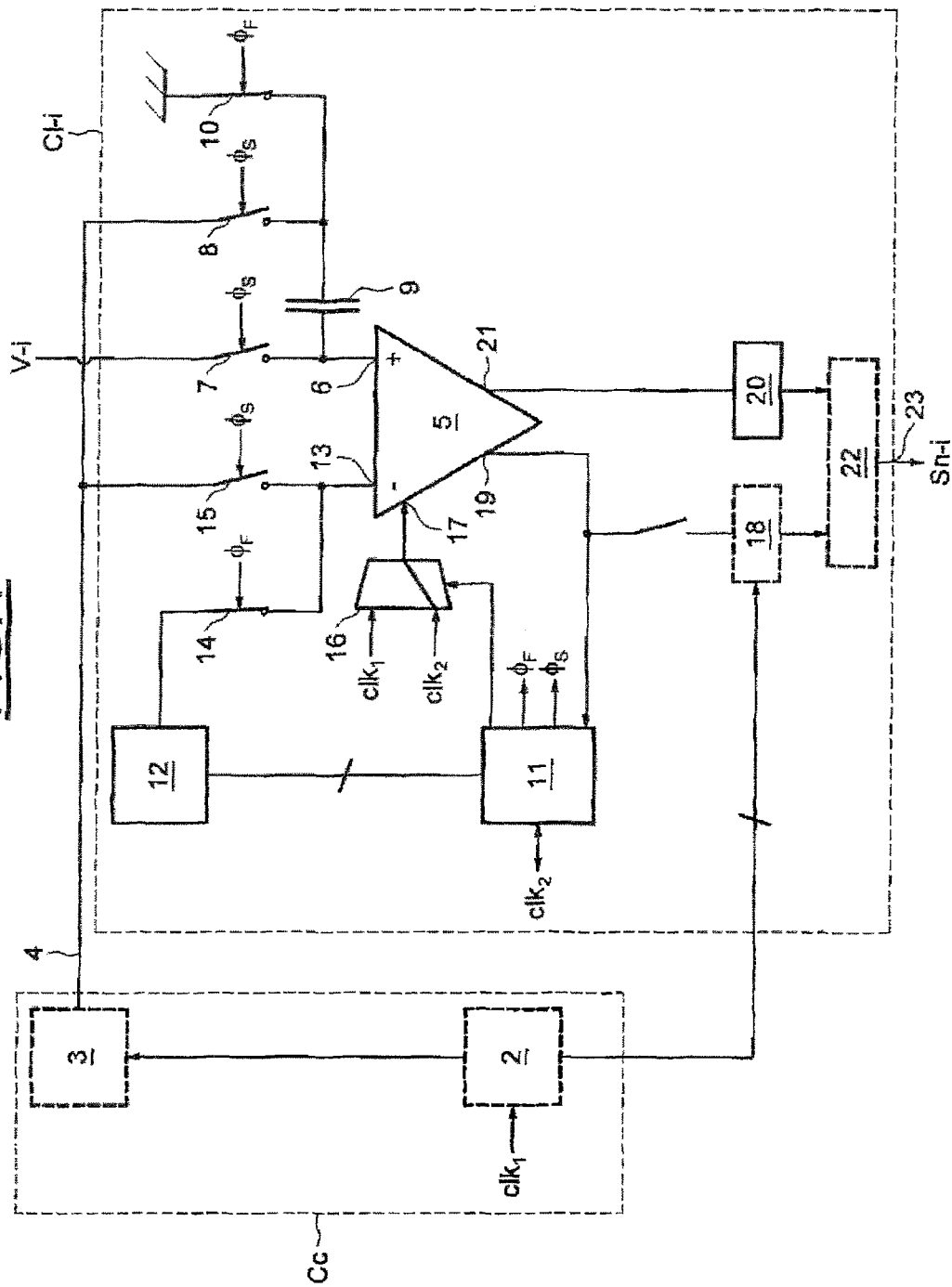
FIG. 4 represents a circuit diagram of the conversion device according to a second operational configuration.

The change of state of the output signal of the comparator 5 is also sent to the digital sequencer 11, which then places the local circuit Cl-i in a second configuration, which is illustrated in FIG. 4.

The sequencer 11 places the switches 7, 8 and 18 in the open state, thus isolating the local circuit Cl-i from the channel V-i and from the common line 4. This being done, the voltage across the terminals of the capacitor 9 is equal to the difference between the value of the analog signal of the channel V-i and the value of the determined analog signal which caused said change of state, this difference being referred to as an "residual" or "remainder". The capacitor constitutes a storage of this residual or remainder, the value of which is equal to or less than said step between two successive values of the analog signals delivered by the convertor 3 and said step being to be added to the value of said detected analog signal which caused the change of state of the output of the comparator, in order to obtain the value of the analog signal Sa-i to be converted.

The sequencer 11 places the switch 10 in the closed state in order to connect the convertor 12 to the input 13 of the comparator 5, places the switch 14 in the closed state in order to connect the corresponding terminal of the capacitor 9 to the input 8 of the comparator 5, and controls the circuit 16 so that the comparator 5 is subjected to the clock signal clk2.

For the local circuit Cl-i in question, the execution of a second conversion phase then begins, which is carried out specifically by successive approximations so as to convert the remainder into successive least-significant bits n of digital signals. Such a conversion by successive approximations is described, in particular, on pages 143 onward of the manual entitled "Principles of Data Conversion System Design", written by Behzad Razavi and published by the IEEE Press in 1995, and may, for example, be carried out as described below.

An upper analog bound and a lower analog bound are stored in the convertor 12, the difference between which is greater than the step of the aforementioned succession of steps. For example, this inter-bound difference may be equal to two steps.

Under the effect of a first clock signal clk2, the sequencer generates an encoded signal which is converted by the convertor 12 into an analog signal, the value of which corresponds to half the aforementioned inter-bound difference.

Two cases may arise.

According to a first case, if the value of the analog signal coming from the convertor 12 is greater than the value of the signal coming from the capacitor 9, the output 21 of the comparator 5 does not change state.

According to a second case, if, conversely, the value of the analog signal coming from the convertor 12 is less than the value of the signal coming from the capacitor 9, the output 21 of the comparator 5 changes state.

In either case, the state of the output 21 of the comparator 5, which constitutes a first least-significant bit of a digital signal, is recorded in the storage register 20.

Next, under the effect of a second clock signal clk2, if the first case occurred, the sequencer 11 generates another encoded signal which is converted by the convertor 12 into another analog signal, the value of which corresponds to half the lower half of the aforementioned inter-bound difference. If, conversely, the second case occurred, the sequencer 11 generates another encoded signal which is converted by the convertor 12 into another analog signal, the value of which corresponds to half the upper half of the aforementioned inter-bound difference.

Here again, two cases may arise.

According to a first case, if the other analog signal coming from the convertor 12 is greater than the signal coming from the capacitor 9, the output 21 of the comparator 5 does not change state.

According to a second case, if conversely the other analog signal coming from the convertor 12 is less than the signal coming from the capacitor 9, the output 21 of the comparator 5 changes state.

In either case, the state of the output 21 of the comparator 5, which constitutes a second least-significant bit of a digital signal, is recorded in the storage register 20.

Next, at each clock signal clk2, and in an equivalent way, the sequencer generates an encoded signal which is converted by the convertor 12 into an analog signal, the value of which is equal to the lower or upper half of the remaining half, and the state of the output 21 of the comparator 5, which in each case constitutes a least-significant bit of a digital signal, is recorded in the storage register 20.

The aforementioned steps are repeated until a predetermined number of states of the output of the comparator 5, equal to the number of clock signals clk2 delivered, have been recorded in the storage register 20. An encoded signal of a number n of least-significant bits of a digital signal, the number of which is equal to the number of clock signals clk2 delivered, is then recorded in the storage register 20.

This having been done, the sequencer 11 controls the assembly circuit 22 so that the latter assembles the encoded signals of most-significant bits m which are recorded in the storage register 18, and the encoded signals of least-significant bits n which are recorded in the storage register 20, so as to deliver on the output 23 a digital signal Sn-i corresponding to the conversion of the analog signal Sa-i.

This assembly consists in carrying out concatenation by redundancy of said encoded signals of most-significant bits and least-significant bits. The digital signal obtained comprises the least-significant bits, with the exception of the highest, and the most-significant bits, to which the highest of the least-significant bits is added, by adding the highest of the least-significant bits and the lowest of the most-significant bits, and transferring the possible remainder to the following most-significant bits, and so on. The result is that the number of bits of the digital signal obtained is equal to the number of most-significant bits m plus the number of least-significant bits n less one.

After this, the sequencer returns the switches 7, 8, 10, 14 and 15 to their initial state, as described with reference to FIG. 3.

Once the entire succession of predetermined first analog signals, coming from the convertor 3 of the common circuit Cc, has been delivered and the local circuits Cl-i have respectively carried out the conversion of the corresponding analog signal Sa-i into a digital signal Sn-i, a new conversion cycle can begin.

The conversion device 1 and the operating method associated therewith have the following advantages.

The minimum total time for carrying out a conversion cycle is equal to or slightly greater than the sum of the time required for generating all of the succession or ramp of the predetermined first analog signals coming from the convertor 3 of the common circuit Cc, the time required by a local circuit Cc-i in order to detect and store the encoded signal of the most-significant bits in the storage register 18, the time for detection by successive approximations by a local circuit Cc-i, and for storage of the encoded signal of the least-significant bits, and the time for assembly of the most-significant bits and the least-significant bits by the assembly circuit 22. This total time can be very short considering the number of bits of the encoded signals Sn-i delivered, which may be high.

Particularly in view of the existence of a common line 4 connecting the common circuit Cc to the local circuits Cl-i, each including a single comparator 5, the area occupied by the circuits can be small and the consumption can consequently be low. The existence of a single comparator 5 in each local circuit Cl-i makes it possible to limit the consequences associated with the losses of offsets between the two conversion phases. Furthermore, assembly by redundancy of the most-significant bits and the least-significant bits makes it possible to compensate at least in part for the possible imperfections of the comparator 5 and the possible irregularities of the steps of the aforementioned succession of steps.

Figure 5:
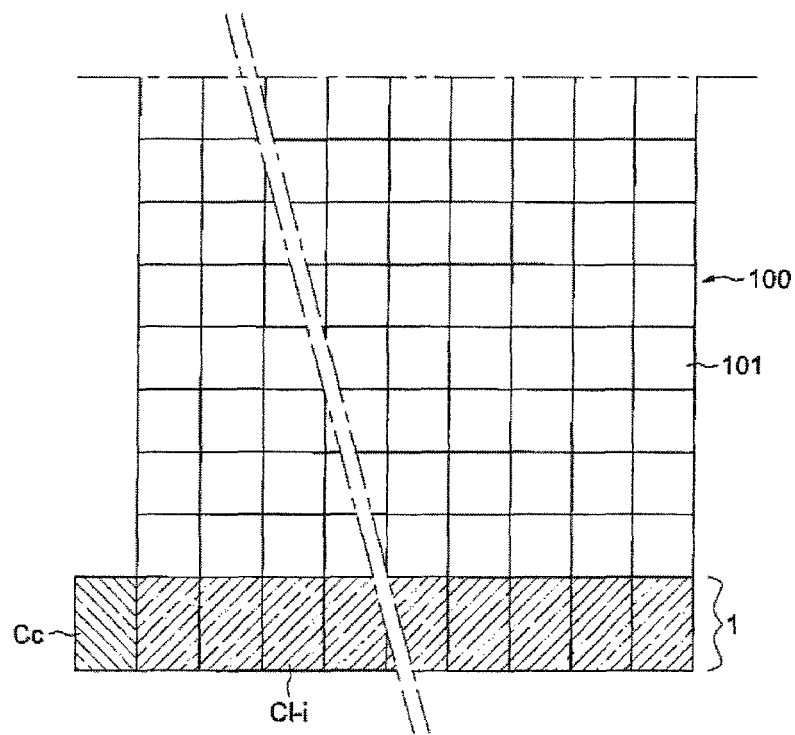
FIG. 5 schematically represents a layout of the conversion device.

FIG. 5 illustrates a matrix 100, which comprises a plurality of sensors 101 arranged next to one another on lines and columns. Arranged on one side of this matrix 100, there is a conversion device 1, the local circuits Cl-i of which occupy the width of the corresponding columns and are arranged on a line, at the end of which the common circuit Cc is placed.

In the description above, it was considered that the staircase values of the first analog signals decrease. According to one alternative embodiment, these values could increase successively. In this case, the change of state of the comparator 5 takes place on passing from an upper level value to the value of the analog signal to be converted. The remainder stored in the capacitor 9 is then the complement of the aforementioned remainder with respect to the difference or step between the level values.

According to one exemplary embodiment, an amplifier could be interposed between the capacitor 9 and the input 6 of the comparator 5, so as to amplify the value of the remainder stored in the capacitor 9, in order to improve the noise immunity and facilitate production of the signals coming from the convertor 12.

The present invention is not limited to the examples described above. Many other alternative embodiments are possible without departing from the scope of the invention.

The invention claimed is:

1. A method for converting analog signals, respectively present on a plurality of channels, into digital signals, comprising:
generation of a succession, common to all the channels, of predetermined first analog signals having predetermined values in a staircase with wide successive steps, each value of which corresponds to most-significant bits of digital signals,
and, for each channel:
comparison of the value of the analog signal to be converted successively with each of said predetermined values,
detection of a predetermined first value of the first analog signal close to the value of the analog signal to be converted,
storage of the values of the most-significant bits corresponding to said detected predetermined first value,
storage of the residual or remainder resulting from the difference between the value of the analog signal to be converted and said detected predetermined value,
comparison, by successive approximations, of said residual or remainder with predetermined second analog signals contained between two bounds of analog signals, the difference between which is greater than said step of said succession, successive storage of the states of the results of the comparison by successive approximations, corresponding to least-significant bits of digital signals, assembly of the most-significant bits and the least-significant bits, so as to deliver a digital signal corresponding to the value of the analog signal to be converted, this digital signal comprising the least-significant bits, with the exception of the highest, and the most-significant bits, to which the highest of the least-significant bits is added.

2. The method as claimed in claim 1, comprising:

comparison of the value of the analog signal to be converted successively with each of said predetermined values, in decreasing order, detection of the determined first value of the first analog signal less than the value of the analog signal to be converted.

3. A device for converting analog signals, respectively present on a plurality of channels, into digital signals, comprising:

a common generator circuit (2, 3) capable of generating a succession of predetermined first analog signals having predetermined first values corresponding to most-significant bits of digital signals, and, for each channel, a local circuit comprising:

a first comparison means, including a single comparator (5), for comparing said predetermined first analog signals with the analog signal to be converted, a first means (18) for storing the most-significant bits of digital signals, corresponding to the value of a predetermined first analog signal close to the corresponding analog signal to be converted and detected by said first comparison means, a means (9) for storing the residual or remainder resulting from the difference between the value of the corresponding analog signal to be converted and said detected predetermined first value, a generator means (11, 12) capable of generating a predetermined number of second analog signals, a second comparison means, including said single comparator (5) for comparing by successive approximations said second analog signals respectively with said residual or remainder, a second means (20) for storing the least-significant bits of digital signals, corresponding to the results coming from said second comparison means, and an assembly means for assembling said most-significant bits and said least-significant bits, so as to deliver a digital signal corresponding to the corresponding analog signal to be converted.

4. The device as claimed in claim 3, wherein the means for storing the residual or remainder comprises a capacitor (9).

5. A matrix of sensors, which is equipped with a conversion device as claimed in claim 3, the local circuits being placed at the ends of the columns of this matrix, on a line at the end of which the common circuit is placed.

\* \* \* \* \*